(12) United States Patent
Go et al.

(10) Patent No.: US 7,528,475 B2
(45) Date of Patent: May 5, 2009

(54) BGA PACKAGE WITH STACKED SEMICONDUCTOR CHIPS AND METHOD OF MANUFACTURING THE SAME

(75) Inventors: Jun-Young Go, Cheonan-si (KR); Byung-Seok Jun, Cheonan-si (KR); Jae-Hong Kim, Cheonan-si (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/603,216

(22) Filed: Nov. 22, 2006

(65) Prior Publication Data

US 2007/0063332 A1    Mar. 22, 2007

Related U.S. Application Data

(62) Division of application No. 10/850,154, filed on May 21, 2004, now Pat. No. 7,262,080.

(30) Foreign Application Priority Data

Jul. 18, 2003    (KR) ................................ 2003-49137

(51) Int. Cl.
*H01L 25/11* (2006.01)
(52) U.S. Cl. ................................ 257/686; 257/E25.027
(58) Field of Classification Search ........................ None
See application file for complete search history.

(56) References Cited

U.S. PATENT DOCUMENTS 6,072,233 A * 6/2000 Corisis et al. ................ 257/686
6,451,624 B1 9/2002 Farnworth et al.
6,451,626 B1 9/2002 Lin
6,548,330 B1 4/2003 Murayama et al.
6,740,546 B2 5/2004 Corisis et al.
2001/0026010 A1 * 10/2001 Horiuchi et al. ............. 257/678
2002/0000648 A1 1/2002 Leong et al.

FOREIGN PATENT DOCUMENTS

| KR | 1999-0086915 | 12/1999 |
|---|---|---|
| KR | 010056937 A | 7/2001 |
| KR | 2002-0043435 | 6/2002 |

* cited by examiner

*Primary Examiner*—Evan Pert
*Assistant Examiner*—Ben P Sandvik
(74) *Attorney, Agent, or Firm*—Harness, Dickey & Pierce, P.L.C.

(57) ABSTRACT

A package with two or more stacked semiconductor chips and a method of manufacturing the same. In the method, an upper semiconductor chip package and a lower semiconductor chip package are prepared. Solder balls are formed on a substrate of the lower package to connect the upper and lower packages. A semiconductor chip and the solder balls are molded and then ground until the solder balls are exposed. Solder balls are formed on the bottom of a substrate of the upper package. The upper package is stacked on the lower package such that the solder balls of the lower package are in contact with the solder balls of the upper package. A reflow process is performed on the lower package and the upper package, which are stacked, to physically connect the upper and lower packages.

10 Claims, 7 Drawing Sheets

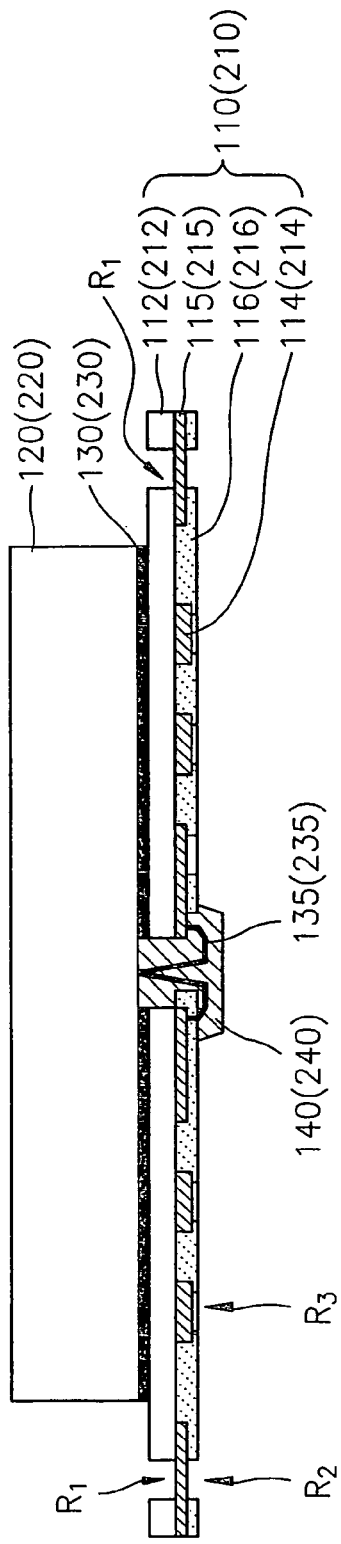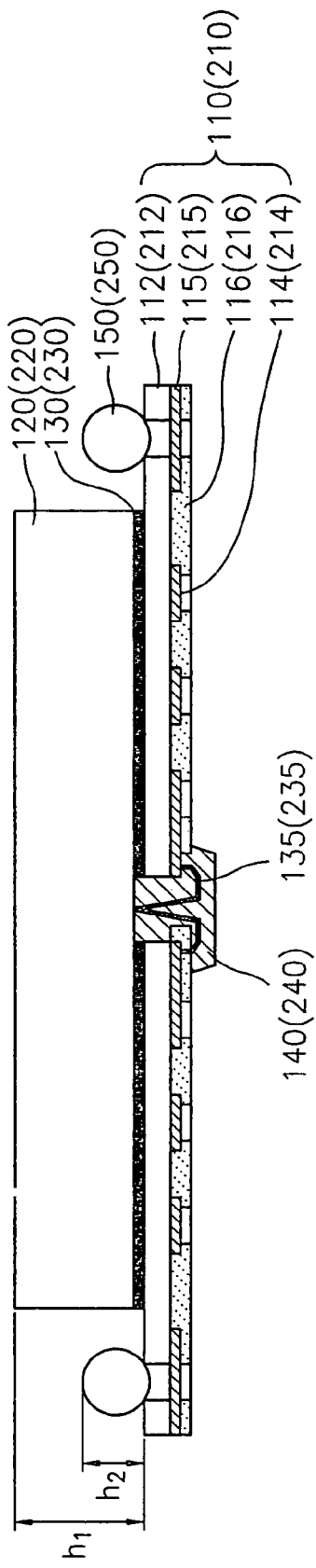

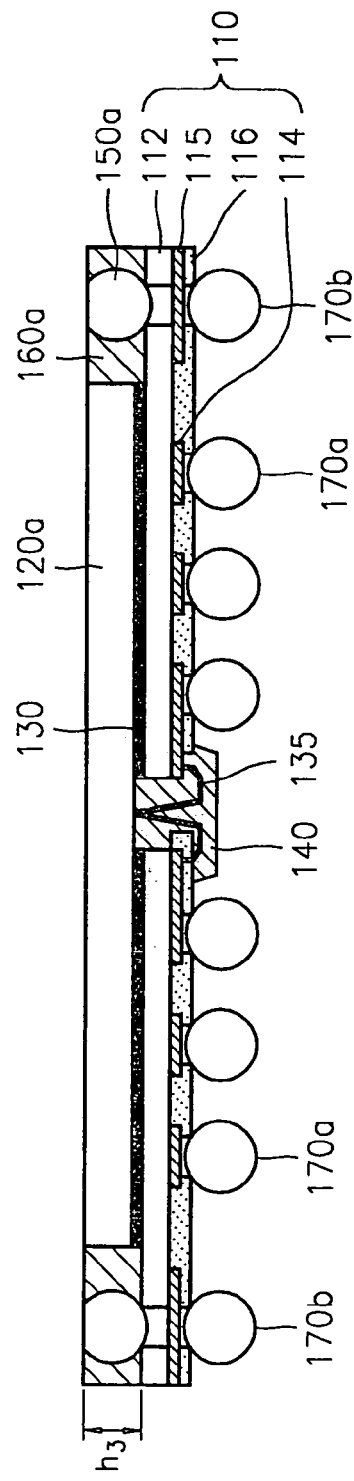
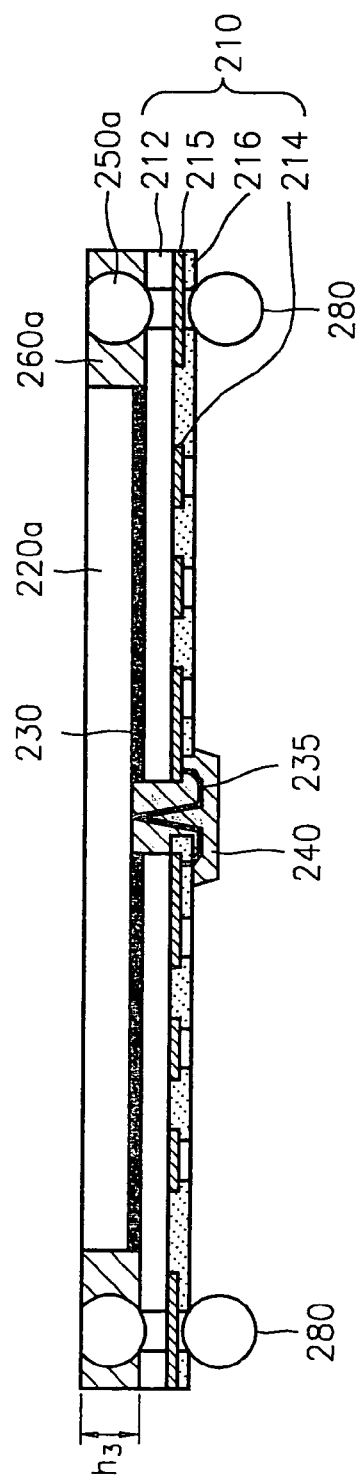

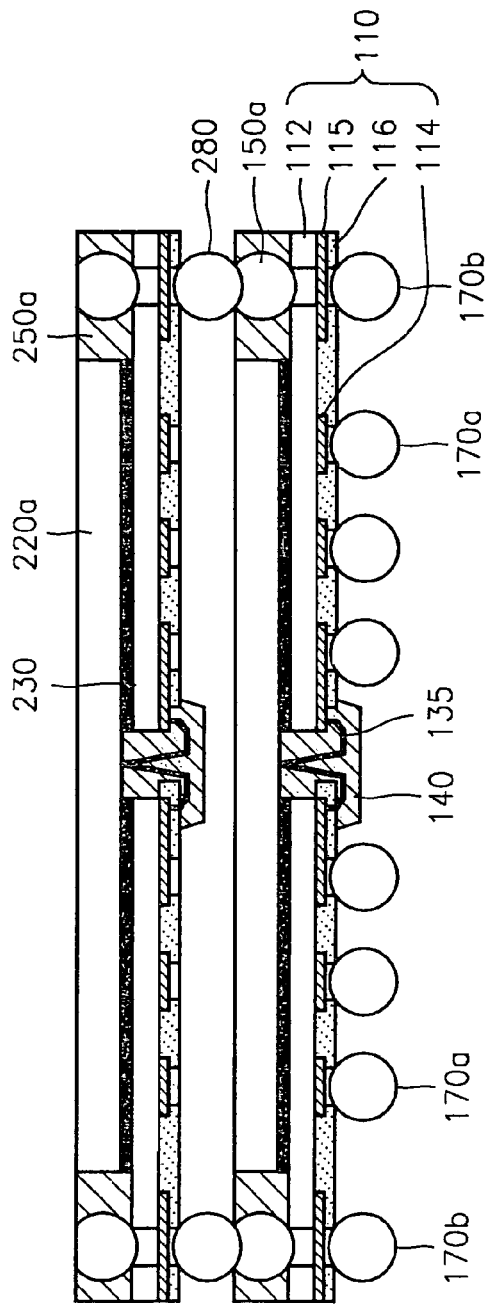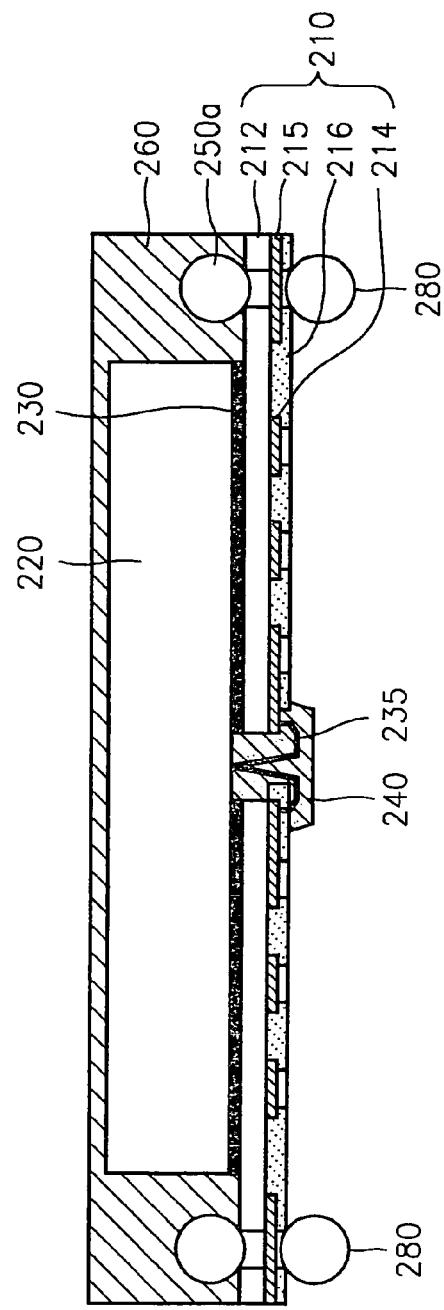

BGA PACKAGE WITH STACKED SEMICONDUCTOR CHIPS AND METHOD OF MANUFACTURING THE SAME

This application is a divisional application of U.S. application Ser. No. 10/850,154 filed May 21, 2004, now U.S. Pat. No. 7,262,080 which claims the benefit of priority of Korean Patent Application No. 2003-49137, filed on Jul. 18, 2003, in the Korean Intellectual Property Office, the disclosure of which are herein incorporated by reference in their entirety by reference.

BACKGROUND OF THE INVENTION

1. Field of the Invention

The present invention relates to a semiconductor package, and more particularly, to a ball grid array (BGA) package with two or more stacked semiconductor chips and a method of manufacturing the same.

2. Description of the Related Art

A semiconductor chip packaging process may be a process of manufacturing semiconductor chips. Semiconductor chip packages may be used to electrically connect semiconductor chips to external apparatuses, protect the semiconductor chips from external enviroment by molding, and/or to dissipate heat. There are a variety of methods of electrically connecting semiconductor chips to external apparatuses; a BGA packaging process is an example. BGA packaging processes are used to manufacture high-speed, high-performance semiconductor packages by increasing the number of external connection terminals.

Recently, to increase the performance of electronic products including semiconductor chips, the semiconductor chips have been scaled down and/or become lighter. To achieve this, various semiconductor packaging methods have been developed. For example, flip chip package (FCP), chip scale package (CSP), or multi chip package (MCP) methods are widely used.

In the MCP method, two or more semiconductor chips of the same or different type are mounted on a single substrate. Semiconductor chips in an MCP may be arranged in series on the same level and/or be sequentially stacked in a vertical direction. The stacking of semiconductor chips may be better for small-sized electronic products since the area occupied by a package can be reduced to enable the CSP method.

FIG. 1 is a cross-sectional view of a conventional package with stacked semiconductor chips, which is disclosed in Korean Patent Laid-open Publication No. 2001-0056937.

Referring to FIG. 1, semiconductor chips 10 and 12, beneath which bonding pads 11 and 13 are respectively mounted, may be adhered to lead frames 20 and 50 having inner leads 21 and 51 and outer leads 22 and 52. A plurality of protrusions 23 and 53 may be formed in the center of the bottoms of the lead frames 20 and 50. Epoxy molding compounds (EMCs) 60 and 61 may cover the sides and the top surfaces of the semiconductor chips 10 and 12. The outer leads 22 and 52 may be exposed on both sides of the EMCs 60 and 61, and portions (for example, the bottom as shown in FIG. 1) of the protrusions 23 and 53 may also be exposed. An upper penetration hole 24 and a lower penetration hole 54, which are formed in the outer leads 22 and 52, respectively, may be electrically connected to each other by solder balls 70. Also, solder balls 71 for connecting external terminals are mounted on the protrusions 53 of the lower lead frame 50.

In a conventional package with stacked semiconductor chips, semiconductor chips may be stacked on lead frames that all have the same shape, and it may be possible to reinforce the adhesion between the stacked semiconductor chips. However, conventional packages with stacked semiconductor chips may have the following disadvantages.

First, because an EMC may cover the top surface of a semiconductor chip (as shown in FIG. 1), the height of a package with stacked semiconductor chips may be greater than the sum of the thicknesses of the lead frames (or substrates) and the semiconductor chips. This leads to an increase in the thickness of the overall semiconductor packages, which may hinder the manufacture of thinner semiconductor packages.

Second, solder balls for connecting packages may be exposed to an external environment. That is, because portions for connecting packages are not molded by an EMC, the reliability of the conventional package with stacked semiconductor chips may be degraded after using the package for many hours.

Korean Patent Laid-open Publication No. 2002-0043435 and Korean Patent Registration No. 0271656 propose examples of packages with stacked semiconductor chips and methods of manufacturing the same, which may have the same disadvantages as the package shown in FIG. 1. Further, a conductive post disclosed in Korean Patent Laid-open Publication No. 2002-0043435 may be inadequate for mass production considering the manufacturing cost and/or process complexity.

SUMMARY OF THE INVENTION

The exemplary embodiments of the present invention provide a BGA package with stacked semiconductor chips, which is thinner and/or more reliable and/or permits less expensive mass production.

The exemplary embodiments of the present invention also provide a method of manufacturing the BGA package with stacked semiconductor chips.

In an exemplary embodiment of the present invention, the BGA package comprises a first package and a second package stacked on the first package.

The first semiconductor chip package may includes a first substrate, a first semiconductor chip, a plurality of inner solder balls for connecting packages, solder balls for connecting external terminals, and a first EMC. The first substrate may include first land pads, which have bottoms exposed by through holes, and first interconnection pads, which are formed outside the first land pads and have top surfaces and bottom surfaces that may be exposed by upper grooves and lower grooves, respectively. The first semiconductor chip may be adhered to the first substrate such that a circuit forming surface of the first semiconductor chip faces the first substrate. The inner solder balls for connecting packages may be formed on the upper grooves of the first substrate, and the solder balls for connecting external terminals may be formed on the through holes and the lower grooves of the first substrate. The first semiconductor chip and the inner solder balls may be molded by a EMC and may be ground to be at the same level and expose contact parts of the inner solder balls.

The second package may have same structure as the first package except the second package need not have a plurality of solder balls formed on the land pads of the second substrate and may not have a plurality of inner solder balls formed on the plurality of upper grooves of the second substrate. The outer solder balls may be formed on the lower grooves of the second package and connected to the inner solder balls of the first package one-to-one corresponding to the same.

In another exemplary embodiment of the present invention, a method of manufacturing a BGA package with stacked semiconductor chips comprises preparing the first package and the second package; stacking the second package on the first package such that the outer solder balls of the second package correspond to the inner solder balls of the first package; and reflowing the first package and the second package such that the outer solder balls of the second package are connected to the inner solder balls of the first package.

In an exemplary embodiment of the present invention, a method of manufacturing a BGA package with stacked semiconductor chips comprises preparing the first package and the second package; stacking the second package on the first package such that the outer solder balls of the second package correspond to the inner solder balls of the first package; reflowing the first package and the second package such that the outer solder balls of the second package are connected to the inner solder balls of the first package; and grinding a surface opposing the active surface of the second semiconductor chip.

In exemplary embodiments of the present invention, solder balls may be formed on the sides of upper and lower semiconductor chips so as to connect semiconductor chip packages. The semiconductor chips and the solder balls may be molded and ground until the solder balls are exposed. As a result, thin and/or lightweight packages with stacked semiconductor chips may be manufactured.

In another exemplary embodiment of the present invention, a semiconductor chip package includes a first substrate having an upper surface and a lower surface, at least one partially ground semiconductor chip mounted on the upper surface of the first substrate, a plurality of partially ground solder balls, each including exposed contact portions, formed on the upper surface of the first substrate and electrically connected to the first substrate; and a partially ground epoxy protecting all but a top surface of the at least one partially ground semiconductor chip and the exposed contact portions.

In another exemplary embodiment of the present invention, a method of manufacturing a stacked package includes preparing a first package including a first substrate having an upper surface and a lower surface, at least one partially ground semiconductor chip mounted on the upper surface of the first substrate, a plurality of partially ground solder balls, each including exposed contact portions, formed on the upper surface of the first substrate and electrically connected to the first substrate, and a partially ground epoxy protecting all but a top surface of the at least one partially ground semiconductor chip and the exposed contact portions; preparing a second package including a second substrate having an upper surface and a lower surface, at least one partially ground semiconductor chip mounted on the upper surface of the second substrate, a partially ground epoxy protecting all but a top surface of the at least one additional semiconductor chip and the exposed contact portions; preparing a plurality of solder balls for connecting the first package to the second package; stacking the second package on the first package by connecting the plurality of partially ground solder balls of the first substrate and the plurality of solder balls; and reflowing the first package and the second package.

BRIEF DESCRIPTION OF THE DRAWINGS

The above and/or other features of the present invention will become readily apparent by from the description of the exemplary embodiments that follows with reference to the attached drawings in which:

FIGS. 6 through 12 are example cross-sectional views illustrating exemplary portions described in the flow chart of FIG. 2.

FIG. 13 is an example cross-sectional view illustrating exemplary portions described in the flow chart of FIG. 5.

DETAILED DESCRIPTION OF EXEMPLARY EMBODIMENTS OF THE INVENTION

Figure 1:
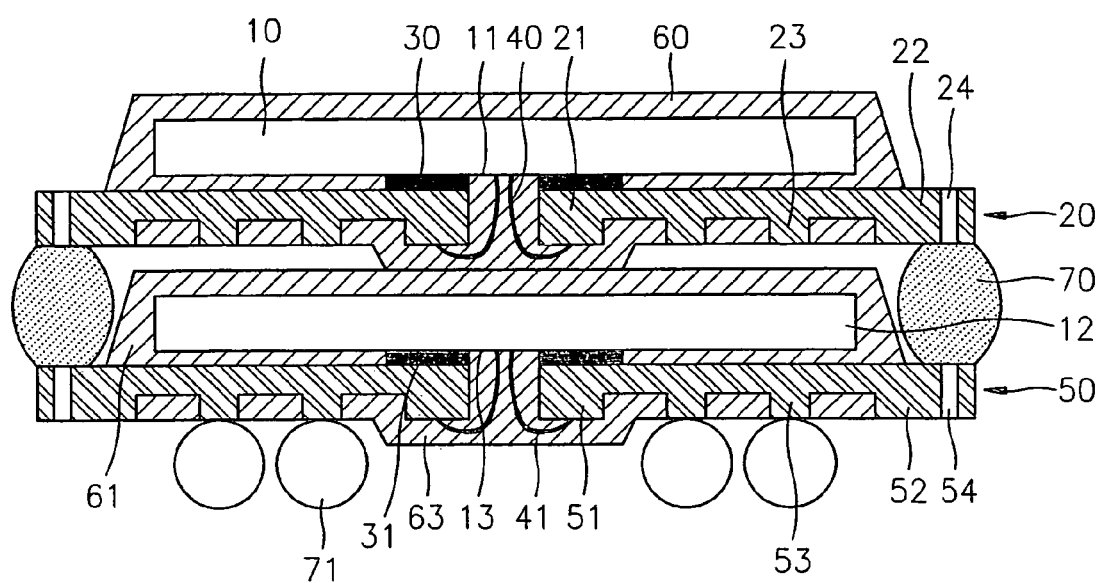
FIG. 1 is a cross-sectional view of a conventional BGA package with stacked semiconductor chips.

The present invention will now be described more fully with reference to the accompanying drawings, in which exemplary embodiments of the invention are shown. However, the present invention may be embodied in many different forms and should not be construed as being limited to the exemplary embodiments set forth herein. Rather, these exemplary embodiments are provided for the purpose of illustration; the present invention covers various changes in form and details as will be readily contemplated by those ordinarily skilled in the art.

It should also be noted that the thicknesses of various layers and regions in the stacked package have been exaggerated in the drawings for the purpose of clarity and the same drawing reference numerals are used for the same elements even in different drawings.

It should also be noted that a layer is considered as being formed "on" another layer or substrate when formed either directly on the referenced layer or the substrate or formed on other layers or patterns overlaying the referenced layer.

Figure 2:
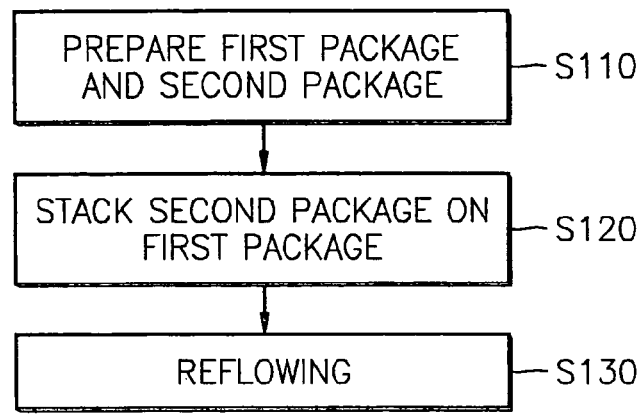
FIG. 2 is a flowchart illustrating a method of manufacturing a BGA package with stacked semiconductor chips according to an exemplary embodiment of the present invention.

FIG. 2 is a flowchart illustrating a method of manufacturing a BGA package with stacked semiconductor chips according to an exemplary embodiment of the present invention. Referring to FIG. 2, a first package and a second package may be prepared (S110). In a BGA package with stacked semiconductor chips, the first package may be positioned first and include inner solder balls for connecting external terminals. The second package may be positioned above the first package and may be electrically connected to the inner solder balls of the first package by outer solder balls.

Figure 3:
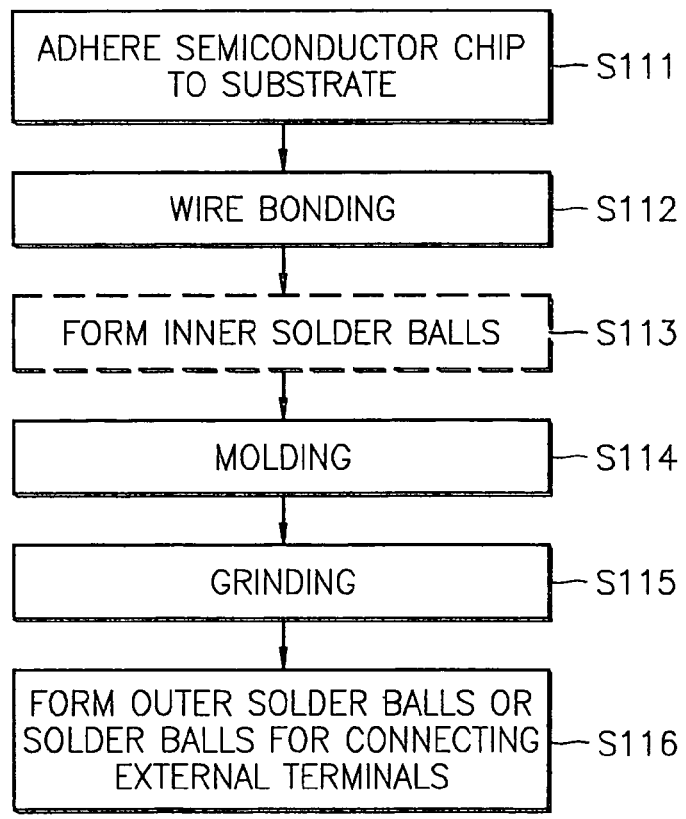
FIG. 3 is an example flowchart illustrating preparing first and second packages shown in FIG. 2.

FIG. 3 is an example flowchart that illustrates S110 of FIG. 2 in more detail. FIGS. 6 through 10B are example cross-sectional views illustrating S110. For simplicity, the second semiconductor chip package is illustrated together with the first semiconductor chip package in FIGS. 3-10B.

Referring to FIGS. 3 and 6, semiconductor chips 120, 220 may be adhered to substrates 110, 210 using adhesives 130, 230 (S111). The adhesives 130 and 230 may be formed of an insulating material. The semiconductor chips 120, 220 may be adhered to the substrate 110, 210 such that an active surface having a circuit formed thereon of the semiconductor chips 120, 220, on which bonding pads (not shown) are formed, face the substrates 110 and 210. Accordingly, exemplary embodiments of the present invention may be applied to a flip chip package (FCP).

The substrates 110, 210 may include insulating substrates 112, 212, land pads 114, 214, photo solder resists (PSRs) 116, 216, and/or interconnection pads 115 and 215. The insulating substrates 112 and 212 may be any insulating substrates, which are used for a printed circuit board (PCB) in the field of semiconductor packages. For example, the insulating substrates 112 and 212 may be formed of cured plastic insulating materials, such as epoxy resin or flexible materials such as polyimide films.

Each of the insulating substrates 112 and 212 may have an opening, through which a bonding wire is formed, and concave portions for exposing the interconnection pads 115 and 215. Upper grooves $R_1$ may be spaces formed by the concave portions. The upper grooves $R_1$ may be formed in edges on both sides of each of the substrates 110 and 210.

Interconnections may be formed on a surface of the insulating substrates 112, 212 or inside the insulating substrates 112, 212. In the an exemplary embodiment, the interconnections may include the land pads 114, 214 and the interconnection pads 115, 215 and may be formed on the bottoms of the insulating substrates 112, 212. The land pads 114, 214 may be portions of the interconnections, which may be connected to the solder balls (not shown) for connecting external terminals, and the interconnection pads 115, 215 may be other portions of the interconnections, which electrically connect the first package to the second package, such that the second package is electrically connected to external terminals.

The interconnection pattern of the first package may be shaped differently from that of the second package. For example, the interconnection of the first package may have any interconnection pattern formed on a substrate of conventional BGA packages. However, the interconnection pattern of the second package may be shaped such that the land pads 214 correspond one-to-one to and are electrically connected to the interconnection pads 215.

The PSRs 116, 216 may be formed on the bottoms of the insulating substrates 112, 212. The PSRs 116, 216 may include concave portions that expose the land pads 114, 214 and the interconnection pads 115, 215. Through holes $R_3$ may be spaces formed by some concave portions to expose the land pads 114, 214, and lower grooves $R_2$ may be spaces formed by the other concave portions to expose the interconnection pads 115, 215. The lower grooves $R_2$ may positionally correspond to the upper grooves $R_1$. However, the PSR 216 of the second package need not include the through holes $R_3$ that expose the land pads 214.

Referring to FIGS. 3 and 6, wire bonding may be performed to connect the bonding pads (not shown) of the semiconductor chips 120, 220 to the interconnections of the substrates 110, 220 by wires (S112), for example gold wires. Bonding wires 135, 235 may be connected to the interconnections via the openings of the substrates 110, 210. Protective members 140, 240 may be formed on the bonding wires 135, 235 to cover the bonding wires 135, 235.

Referring to FIGS. 3 and 7, inner solder balls 150, 250 may be formed on the upper grooves $R_1$ of the substrates 110, 210. The inner solder balls 150, 250 may be formed of, for example, an alloy of tin and lead. Although the inner solder balls 150, 250 may be formed to be lower than a top surface of the semiconductor chip 120, 220, exemplary embodiments of the present invention are not limited thereto. In exemplary embodiments of the present invention, the height $h_2$ between a top surface of the substrates 110, 210 and a top of the inner solder balls 150, 250 may be less than the height $h_1$ between a top surface of the substrates 110, 210 and a top surface of the semiconductor chips 120, 220, i.e., the opposing sides of the active surfaces of the semiconductor chips 120, 220.

The formation of the inner solder balls 150 and 250 may be part of a first package preparing process and optional to a second package preparing process, which is, thus, illustrated with a dotted line in FIG. 3. For example, if the inner solder balls 250 are formed in the second package preparing process, since the first package preparing process and the second package preparing process may be the same, the overall packaging process may facilitate mass production. However, in a package with two stacked semiconductor chips, the inner solder balls 250 of the second package may be unnecessary and, thus, may be omitted.

Figure 8:
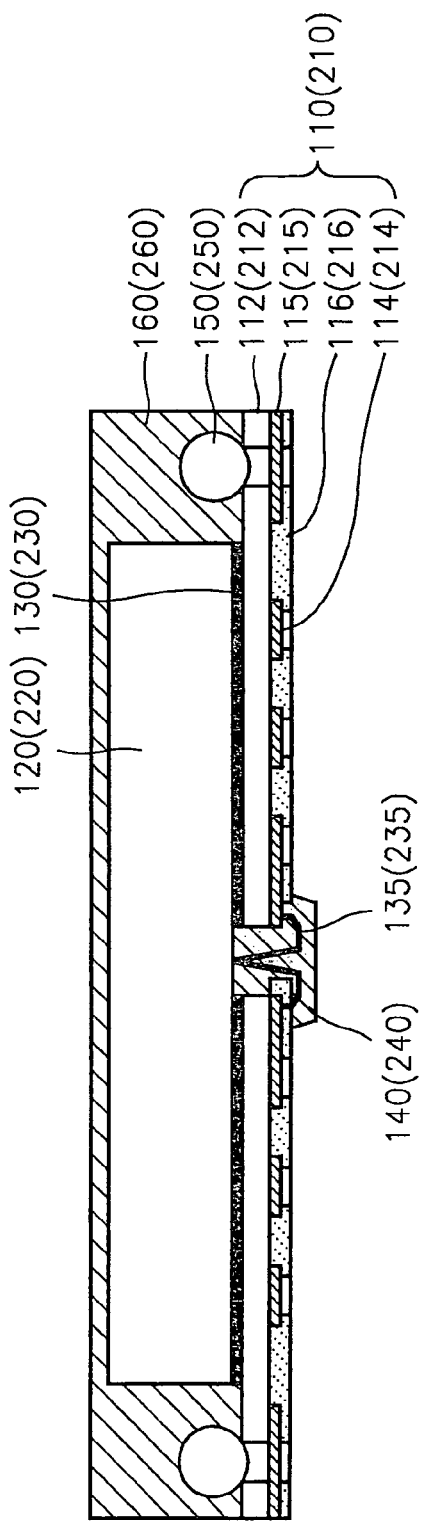

Referring to FIGS. 3 and 8, a molding process may be performed such that the semiconductor chips 120, 220 and the inner solder balls 150, 250 are molded by epoxy molding compounds (EMCs) 160, 260 (S114). The molding process may be any molding process, such as transfer molding. In an exemplary embodiment, the EMCs 160 and 260 are formed sufficiently thick to mold the entire inner solder balls 150 and 250. However, the EMCs 160, 260 need not be formed to cover a top surface of the semiconductor chips 120, 220 or a top surface of inner solder balls 150 and 250, as shown in FIG. 8.

Figure 9:
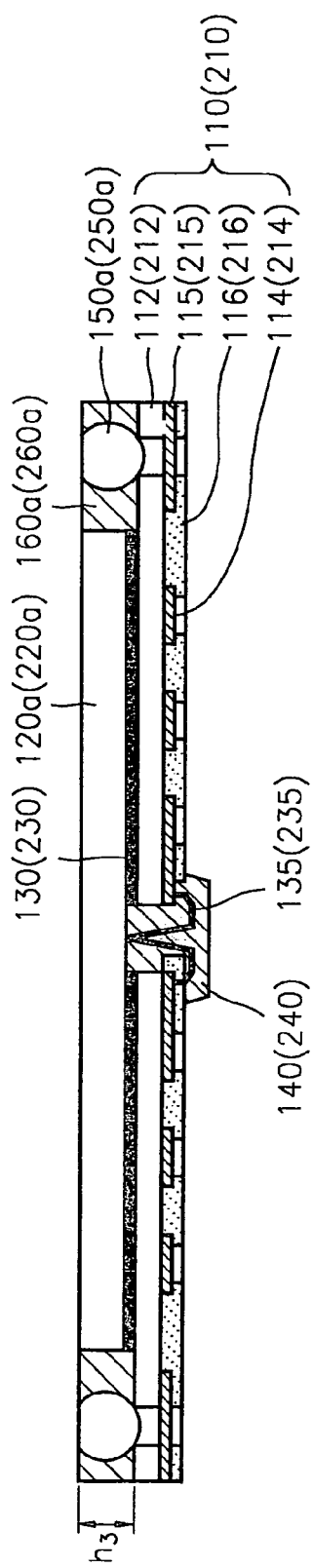

Referring to FIGS. 3 and 9, a top surface of the semiconductor chips 120, 220, i.e., the opposing sides of the active surfaces of the semiconductor chips 120, 220, may be ground (S115). The grinding process may be performed until inner solder balls 150a are exposed. If the semiconductor chip 220 of the second package without inner solder balls 250a is ground, the grinding process may be performed so as not to damage a circuit formed on the semiconductor chip 220. After the grinding process, semiconductor chips 120a, 220a and the inner solder balls 150a, 250a may have a height $h_3$ lower than the height $h_1$ between a top surface of the substrates 110, 210 and a top surface of the semiconductor chips 120, 220 or the height $h_2$ between a top surface of the substrates 110, 210 and a top surface of the inner solder balls 150, 250.

As described above, because a top surface of the semiconductor chips 120 and 220 may be ground, the height of the entire package of stacked semiconductor chips can be reduced. Also, the grinding process may be performed after the inner solder balls 150 and 250 are molded by the EMCs 160 and 260, such that remaining part of the inner solder balls 150, 250 except for contact portions are not exposed to the external environment.

Referring to FIGS. 3 and 10, solder balls 17a and 170b for connecting external terminals may be formed on the through holes $R_3$ and/or the lower grooves $R_2$ of the substrates 110 (S116). This process may be applied to the first package preparing process. The solder balls 170a for connecting external terminals may be formed on the through holes $R_3$ and connected to the interconnection pads 115 in order to connect the semiconductor chip 220a of the second package to external terminals. Thus, the first package shown in FIG. 10 may be completed.

Referring to FIGS. 3 and 11, outer solder balls 280 may be formed on the lower grooves $R_2$ of the substrate 210 (S116). This process may be applied to the second package preparing process. The outer solder balls 280 may be connected to the interconnection pads 215 and electrically connected to the land pads 214, which correspond one-to-one to the interconnection pads 215. Thus, the second package shown in FIG. 11 may be completed.

Referring again to FIG. 2, the completed second package may be stacked on the completed first package (S120). As shown in FIG. 12, at S120, the inner solder balls 150a of the first package may be in contact with the outer solder balls 280 of the second package.

A reflow process may be performed on the first package and the second package (S130). In the reflow process, the inner solder balls 150a and the outer solder balls 280 may be melted by applying an appropriate heat and then cooled such that the inner solder balls 150a are adhered to the outer solder balls 280. Thus, the BGA package with two stacked semiconductor chips may be completed.

Figure 4:
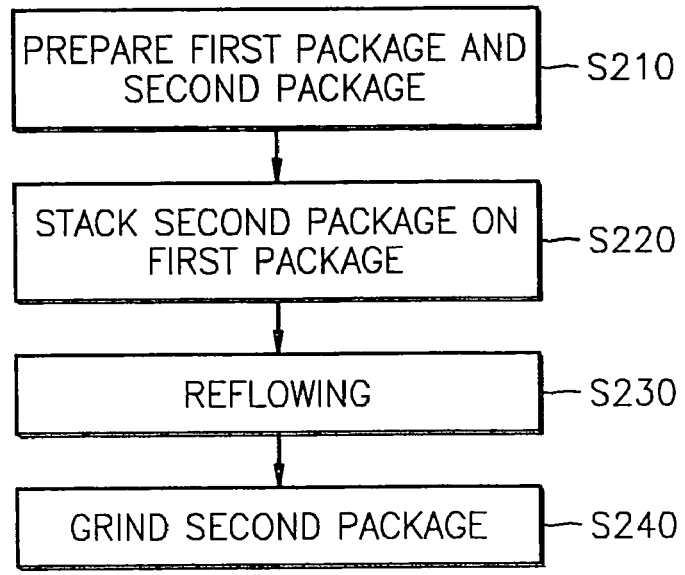
FIG. 4 is a flowchart illustrating a method of manufacturing a BGA package with stacked semiconductor chips according to another exemplary embodiment of the present invention.

FIG. 4 is a flowchart illustrating a method of manufacturing a BGA package with stacked semiconductor chips according to another embodiment of the present invention. Referring to FIG. 4, a first package and a second package may be prepared in the same manner as the first exemplary embodiment (S210). In the BGA package with stacked semiconductor chips, the first package may be positioned below and includes inner solder balls for connecting external terminals. The second package may be positioned above and electrically connected to the inner solder balls of the first package by outer solder balls. In the present exemplary embodiment, because step S210 is performed in the same manner as step S110 of the first exemplary embodiment shown in the flowchart of FIG. 3, a description thereof will not be repeated here.

Figure 5:
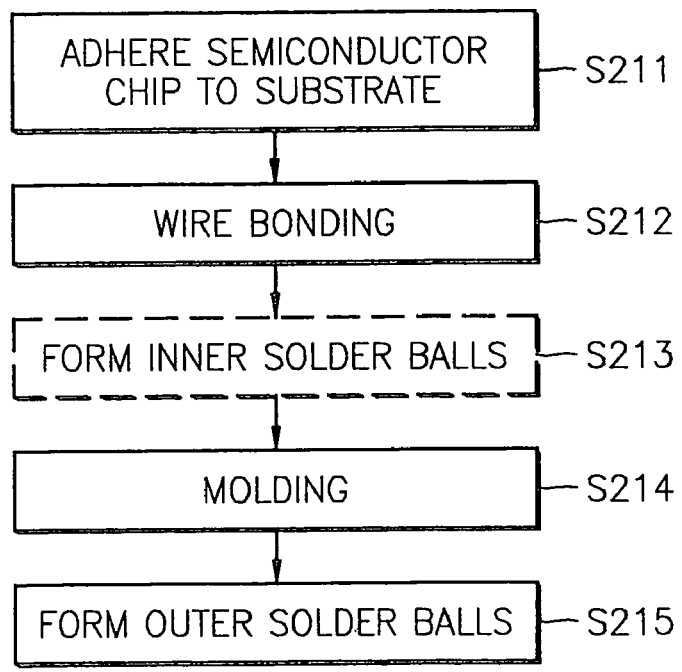
FIG. 5 is an example flowchart illustrating preparing a second package shown in FIG. 4.

FIG. 5 is an example flowchart illustrating the second package preparing process (S210) of FIG. 4 in more detail. The flowchart of FIG. 5 will be described with reference to FIGS. 6 through 8 and 13. Here, the same process steps as in the first exemplary embodiment will be briefly described.

Referring to FIGS. 5 and 6, a semiconductor chip 220 may be adhered to a substrate 210 by using an insulating adhesive 230 (S211). The semiconductor chip 220 may be adhered to the substrate 210 such that an active surface having a circuit formed thereon of the semiconductor chip 220 faces the substrate 210. Wire bonding may be performed to cover a bonding wire 235 with a protective member 240. Referring to FIGS. 5 and 7, inner solder balls 250 may be formed on upper grooves $R_1$ of the substrate 210 (S213). As described above, the inner solder balls 250 may be omitted in the second package. Referring to FIGS. 5 and 8, the semiconductor chip 220 and/or the inner solder balls 250 may be molded by an EMC 260 (S214).

Referring to FIGS. 5 and 13, outer solder balls 280 may be formed on lower grooves $R_2$ of the substrate 210. Unlike the first exemplary embodiment, the outer solder balls 280 may be formed before a grinding process. Thus, the second package preparing process is completed.

Referring again to FIG. 4, the second package may be stacked on the completed first package (S220) such that the inner solder balls 150a of the first package are in contact with the outer solder balls 280 of the second package. A reflow process may be performed on the first package and the second package, which are sequentially stacked (S230). Thereafter, the grinding process may be performed on the second package (S240). Thus, the BGA package with stacked semiconductor chip of the present exemplary embodiment may be completed.

In the exemplary present embodiment, the grinding of the second package may be performed after stacking the first and second packages. After the grinding process is performed, an uppermost semiconductor chip of the entire stacked packages may be ground. Thus, the thickness of a portion that is not ground in the present embodiment is thicker than that of a portion that is not ground in the first embodiment, so as to facilitate the grinding process. Also, it is possible to more finely control the amount of grinding performed in the grinding process of the semiconductor chip.

Exemplary embodiments of the present invention facilitate the manufacture of a BGA package with stacked semiconductor chips using conventional package apparatuses and methods.

Also, in exemplary embodiments of the present invention, the BGA package with stacked semiconductor chips can be finely controlled to a thin thickness. Accordingly, the BGA package with stacked semiconductor chips may exhibit higher performance and/or can be used in lightweight and/or thin electronics products, such as mobile devices.

Further, since portions for connecting upper and lower packages are more completely molded by EMCs or PSRs, the reliability of the BGA package with stacked semiconductor chips improves.

Although exemplary embodiments of the present invention illustrate two stacked semiconductor chip packages, any number of semiconductor chip packages may be stacked, as would be known to one of ordinary skill in the art.

Although exemplary embodiments of the present invention illustrate several, varying, combinations of preparing, grinding, stacking, and reflowing various semiconductor chip packages, any combination or subcombination of these actions may be taken in any order, based on the description provided herein and all such combinations and subcombinations are considered part of the present invention.

It will be apparent to those skilled in the art that other changes and modifications may be made in the above-described exemplary embodiments without departing from the scope of the invention herein, and it is intended that all matter contained in the above description shall be interpreted in an illustrative and not a limiting sense.

What is claimed is:

1. A stacked package, comprising:
at least two semiconductor packages including a first semiconductor chip package and a second semiconductor chip package stacked on the first semiconductor chip package, wherein:
the first semiconductor chip package includes:
 a first substrate having an upper surface and a lower surface, the first substrate is formed with a plurality of first land pads and a plurality of first interconnection pads formed outside the plurality of first land pads, the plurality of first interconnection pads having top surfaces exposed by a plurality of upper grooves formed on the upper surface of the first substrate and bottom surfaces exposed by a plurality of lower grooves formed on the lower surface of the first substrate, the plurality of first land pads exposed on the lower surface of the first substrate by a plurality of through holes formed on the lower surface of the first substrate,
 a first semiconductor chip mounted on the upper surface of the first substrate via a first adhesive, the first semiconductor chip having an active surface with a circuit formed thereon and a surface opposing the active surface, wherein the active surface faces the upper surface of the first substrate,
 a plurality of inner solder balls formed on the upper surface of the first substrate and electrically connected to the first substrate, and
 a plurality of outer solder balls formed on the lower surface of the first substrate,
 wherein the first semiconductor chip and the plurality of inner solder balls are molded by a first epoxy and the surface opposing the active surface of the first semiconductor chip and the plurality of inner solder balls are ground, whereby the plurality of inner solder balls and the first semiconductor chip have same height and the plurality of inner solder balls have exposed contact portions; and the second package includes:
 a second substrate having an upper surface and a lower surface, a second semiconductor chip mounted on the upper surface of the first substrate via a second adhesive, the second semiconductor chip having an active surface with a circuit formed thereon and a surface opposing the active surface, wherein the active surface faces the upper surface of the second substrate, a plurality of outer solder balls formed on the lower surface of the second substrate and electrically connected to the plurality of inner solder balls formed on the first substrate, and a second epoxy molding the second semiconductor chip, wherein the plurality of inner solder balls of the first semiconductor chip package are formed on the upper grooves of the first substrate, the plurality of outer solder balls of the first semiconductor chip are formed on the plurality of lower grooves and the plurality of through holes of the first substrate.

2. The package of claim 1, wherein the second substrate is formed with a plurality of second land pads and a plurality of second interconnection pads corresponding and electrically connected one to one to the plurality of second land pads, the plurality of second interconnection pads having top surfaces exposed by a plurality of upper grooves formed on the upper surface of the second substrate and bottom surfaces exposed by a plurality of lower grooves formed on the lower surface of the second substrate.

3. The package of claim 2, wherein the plurality of outer solder balls of the second semiconductor chip package are formed on the lower grooves of the second substrate.

4. The package of claim 1, wherein the second semiconductor chip package further comprises a plurality of inner solder balls formed on the upper surface of the second substrate, the plurality of inner solder balls of the second substrate are molded by the second epoxy molding compound molding the second semiconductor chip, the surface opposing the active surface of the first semiconductor chip and the plurality of inner solder balls are ground, whereby the plurality of inner solder balls and the first semiconductor chip have same height and the plurality of inner solder balls have exposed contact portions.

5. The package of claim 1, wherein the second semiconductor chip package further comprises a plurality of inner solder balls formed on the upper surface of the second substrate and electrically connected to the plurality of outer solder balls of the second substrate.

6. The package of claim 1, wherein each of the first package and the second package is a flip chip package.

7. The package of claim 1, further comprising a third semiconductor chip package stacked on the second package and having the same structure as the second semiconductor chip package.

8. The package of claim 7, further comprising a fourth semiconductor chip package stacked on the third semiconductor chip package and having the same structure as the second semiconductor chip package.

9. The package of claim 1, wherein the first substrate includes a first insulating substrate, wherein the active surface of the first semiconductor chip is mounted on an upper surface of the first insulating substrate via the first adhesive; and the second substrate includes a second insulating substrate, wherein the active surface of the second semiconductor chip is mounted on an upper surface of the second insulating substrate via the second adhesive.

10. The package of claim 9, wherein the plurality of first interconnection pads are mounted on a lower surface of the first insulating substrate and at least one first bonding wire electrically connects the first semiconductor chip to the plurality of first interconnections pads; and the second substrate includes a plurality of second interconnection pads mounted on a lower surface of the second insulating substrate and at least one second bonding wire electrically connects the second semiconductor chip to the plurality of second interconnections pads.

* * * * *